United States Patent [19]

Magarshack

[11] Patent Number: 4,682,127
[45] Date of Patent: Jul. 21, 1987

[54] ULTRA-HIGH FREQUENCY SIGNAL SWITCHING MATRIX HAVING ACTIVE COMPONENT SWITCHING JUNCTIONS

[75] Inventor: John Magarshack, Reuil Malmaison, France

[73] Assignee: Thomson-CSF, Paris, France

[21] Appl. No.: 640,804

[22] Filed: Aug. 14, 1984

[30] Foreign Application Priority Data

Aug. 17, 1983 [FR] France ............................... 83 13391

[51] Int. Cl.$^4$ ............................................. H04Q 1/00
[52] U.S. Cl. ............................... 333/103; 340/825.91; 379/292
[58] Field of Search ...................... 340/825.79–825.93; 328/62, 105; 307/465, 468, 548, 469, 241, 577, 242, 244, 330, 570, 571, 243, 448–451; 179/18 G, 18 GE, 18 H, 18 GF; 370/54, 58; 343/373, 374; 330/295, 84, 286, 277, 124 R; 333/104, 101, 103, 246, 262, 128, 127, 125, 124, 117, 109; 455/12; 364/716

[56] References Cited

U.S. PATENT DOCUMENTS

| | | | |
|---|---|---|---|
| 3,885,167 | 5/1975 | Berglund | 307/243 X |
| 4,124,899 | 11/1978 | Birkner et al. | 364/716 X |
| 4,206,368 | 6/1980 | Lenderking | 307/244 X |
| 4,316,159 | 2/1982 | Ho | 333/104 |
| 4,420,696 | 12/1983 | Gemma et al. | 328/62 X |
| 4,430,732 | 2/1984 | Saga et al. | 455/12 X |
| 4,472,691 | 9/1984 | Kumar et al. | 340/825.91 X |

FOREIGN PATENT DOCUMENTS 2339757 8/1973 Fed. Rep. of Germany .
2041027 1/1971 France .

OTHER PUBLICATIONS

Ho et al., "Coupler Crossbar Microwave Switch Matrices," 1982, IEEE MTT-S Digest, pp. 239–241.
IBM Technical Disclosure Bulletin, vol. 20, No. 4, (Sep. 1977), G. H. Parikh, "Phase of Island Isolation Circuit," pp. 1311–1312.

*Primary Examiner*—Eugene R. LaRoche
*Assistant Examiner*—Benny T. Lee
*Attorney, Agent, or Firm*—Oblon, Fisher, Spivak, McClelland, & Maier

[57] ABSTRACT

The invention relates to an ultra-high frequency switching matrix. Only active components, i.e. field effect transistors, are used in the integrated circuit construction of the matrix according to the invention. Coupling between an input channel and an output channel is obtained by a power divider on the input channel, which is a bi-drain transistor or a differential amplifier, a controllable switch in the form of a bi-grid transistor or two transistors in series, and a power combiner on the output channel, which is a multi-grid transistor or several transistors in series. Application is to telecommunications, particularly satellite telecommunications.

15 Claims, 6 Drawing Figures

ULTRA-HIGH FREQUENCY SIGNAL SWITCHING MATRIX HAVING ACTIVE COMPONENT SWITCHING JUNCTIONS

BACKGROUND OF THE INVENTION

The present invention relates to a monolithic switching matrix operating in the ultra-high frequency range. All the intersection points of the matrix are identical and are produced with active components, particularly field effect transistors having a gain making it possible to compensate or balance the losses at each switching node or junction.

Ultra-high frequency switching matrixes are used in telecommunications for switching the paths of the beam without any demodulation thereof in base bands. They are produced with passive division-combination couplers using tuned microstrips and the controllable switches are PIN diodes or field effect transistors. The system has a hybrid structure and consequently occupy a larger volume and surface than in integrated circuitry. Moreover, in a switching matrix with passive elements which consequently do not have an inherent gain, the intersection points are all different as a function of their position in the matrix, because it is necessary to take account of losses of each coupler, so that the coupling differs at each point and therefore so do the couplers.

Monolithic technology is completely suitable for producing switching matrixes and it is able to bring about a volume and heat dissipation gain. Two basic elements are used, namely PIN diodes and field effect transistors. These two elements correspond to two different structures, in which the monolithic integrated circuits provide original and interesting solutions for the industrialization of very high frequency telecommunications.

The switching matrix according to the invention is monolithic and uses active components whose gain makes it possible to balance the switched signals independently of the switching losses, in the manner stated hereinbefore. It has the advantage that all the switching points are identical, which facilitates the construction of an integrated circuit. In the switching matrix according to the invention, a signal from a first path or channel is divided by a first system or divider using at least one bi-drain or bi-source field effect transistor or two parallel field effect transistors. The passage of this signal to a second path or channel is controlled by a bi-gate field effect transistor or two field effect transistors in series, or by a PIN diode. The coupling of the signal from the first channel with the second channel is obtained by a second system or combiner, which can be identical to the switching system, i.e. a multi-gate transistor or several transistors in series. In the monolithic integrated circuit, the intersection of the paths of the switching matrix, in the form of metal lines on the surface of the substrate of the integrated circuit pellet, is made possible by the known techniques of a bridge insulated by a dielectric layer, or by an air bridge, the two paths intersecting in the air, or by multi-level shielding, the two paths intersecting in the semiconductor material, or passing from a first to a second face of the integrated circuit pellet by means of metallized holes.

All the means used for realizing a switching matrix according to the invention are consequently homogeneous, because they are integrated circuits and the field effect transistors and conductive metallizations, optionally PIN diodes, are realized on the same semiconductor material pellet. This represents a significant advantage compared with known switching matrixes, which are produced by hybrid techniques and microstrips on beryllium oxide or alumina substrates.

SUMMARY OF THE INVENTION

The present invention specifically relates to a matrix for switching ultra-high frequency electrical signals from a first plurality of input channels or rows towards a second plurality of output channels or columns, the transfer of a signal from an input channel to an output channel being carried out at an intersection point, said switching matrix being characterized in that each switching point comprises:
  a power divider, whose input receives the signal transferred by an input channel and which supplies at its output a signal divided into a plurality of equal signals,
  a controllable switch, controlled by an external signal, which transfers a signal coming from the divider to a power combiner which transmits the signal transmitted by the switch to an output channel, the system constituted by the power divider, the controllable switch and the power combiner being realized by active components of the field effect transistor type.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
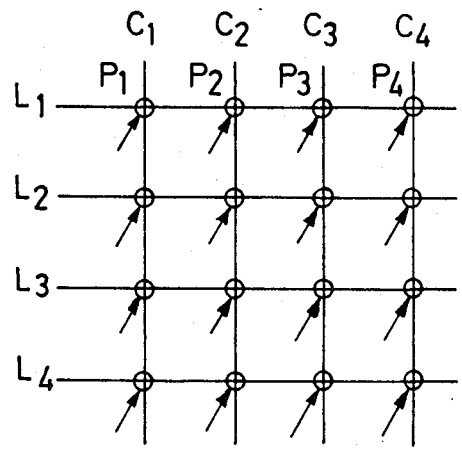
FIG. 1 a general diagram of a series distribution switching matrix.

FIG. 1 is the general diagram of a series distribution switching matrix. In this switching matrix, a plurality of channels which, for simplification purposes will be called rows, e.g. $L_1$ to $L_4$, are switchable with a second plurality of channels, which will be called columns $C_1$ to $C_4$. A first row such as $L_1$ can be switched with any random one of the second columns $C_1$ to $C_4$, at a certain number of switching points $P_1$ to $P_4$. At each of the latter, an arrow in FIG. 1 symbolizes the control action by which the signal from row $L_1$ can be switched to one or more of the columns $C_1$ to $C_4$.

It is obvious that FIG. 1 only represents a small part of the switching matrix, with a view to facilitating the understanding of the drawing, whereas in reality the switching matrixes have a large number of channels.

Figure 2:
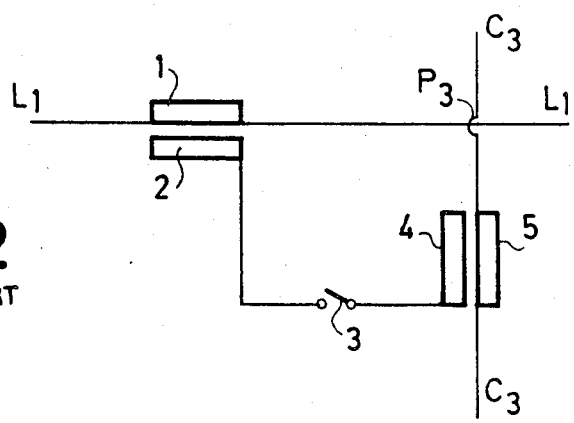
FIG. 2 a prior art intersection point.

Hitherto, and at least in the field of ultra-high frequency covered by the invention, the switching matrixes have been produced by means of the passive means shown in FIG. 2.

In FIG. 1, row $L_1$ is to be switched with e.g. column $C_3$. According to the prior art, row $L_1$ comprises a coupler constituted by a microstrip 1 forming part of row $L_1$ and a second microstrip 2 in parallel with the first microstrip 1. The energy taken by the coupler constituted by microstrips 1 and 2 is directed towards column $C_3$, which also has a second coupler constituted by a microstrip 4, linked with microstrip 2 of row $L_1$ and microstrip 5 forming part of column $C_3$. Coupling between row $L_1$ and column $C_3$ is controlled by means of a switch 3. If the latter is open, there is no coupling at switching point $P_3$, whilst if it is closed coupling takes place. Hitherto the switches have mainly been constituted by PIN diodes and sometimes by field effect transistors.

This type of intersection point is entirely realized with passive means and if a field effect transistor is used as the switch it supplies no gain for compensating coupling losses. Thus, a prior art switching matrix has losses at each intersection point $P_1, P_2, P_3 \ldots P_n$ and it is necessary to take account of these losses in the couplers, so that the energy is distributed in a regular manner over the switch columns. Thus, the coupling levels are 1/10, ⅛, ½ for the different intersection points, assuming that the dimensions of the microstrips differ for each intersection point.

According to the invention, all the intersection points of the switching matrix are identical, because they are produced with active elements, i.e. field effect transistors, which have a gain and which can be controlled by an electrical signal to balance the energy distributed in the matrix columns.

Figure 3:
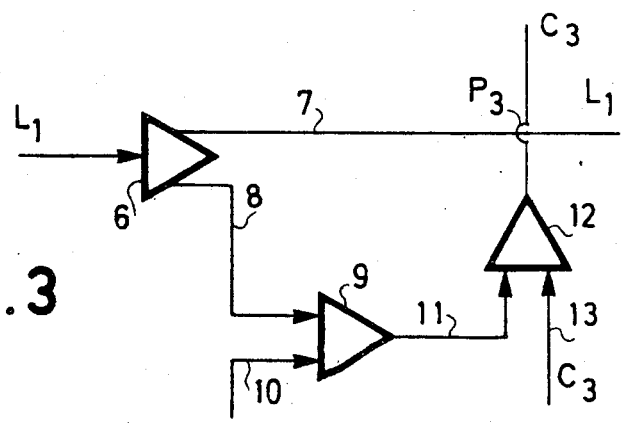
FIG. 3 an intersection point according to the invention for a series distribution structure.

FIG. 3 shows the realization of an intersection point according to the invention for a series distribution of a switching matrix. FIG. 3 can be advantageously compared with FIG. 2 in that the same row $L_1$ is switched on the same column $C_3$ for facilitating the comparison.

The signals from row $L_1$ are firstly divided, for each intersection point, by a power divider by two, represented in the form of an amplifier 6 with two outputs 7 and 8. A first output 7 constitutes the continuation of row $L_1$ and is directed towards the next intersection point $P_4$ because FIG. 3 demonstratively shows the intersection point $P_3$. The second output 8 is passed to a controllable switch 9, which receives on a first input the signal from power divider 6 and on a second input a control signal 10. The output signal of controllable switch 9 is passed to a power combiner 12, which receives on a first input signal 11 from row $L_1$ via power divider 6 and controllable switch 9. On a second input, it receives the signal 13 from column $C_3$ and the output signal from power combiner 12 constitutes the output of column $C_3$.

The power dividers, power combiners and controllable switches of FIG. 3 are symbolically represented. The power divider is in fact a bi-drain or bi-source transistor, but in this case no gain is possible. Power divider 6 can also be in the form of a differential amplifier or two amplifiers in parallel, what is important is that the signal passed to the input of power divider 6 is subdivided between two outputs 7 and 8.

Controllable switch 9 is advantageously a bi-gate field effect transistor, one of these being for collecting the input signal from power divider 6, whilst the control signal 10 is applied to the other. The controllable switch can also comprise two field effect transistors in series, which are equivalent to a single bi-gate field effect transistor. It is desirable that the controllable switch 9 is adapted for the two binary states 0 and 1. Isolation is very important in the open state and must exceed 40 dB.

The power combiner 12 is an amplifier with two inputs and one output, it being necessary that there is no reciprocity between input and output. A preferred embodiment of a power combiner is a bi-gate field effect transistor, which makes it possible to simplify the realization of an integrated circuit, because power divider 6, controllable switch 9 and power combiner 12 are formed by field effect transistors, i.e. using the same technology. Power combiner 12 is either a bi-gate field effect transistor, or is constituted by two field effect transistors with a single gate but connected in series, as for the controllable switch.

Figure 4:
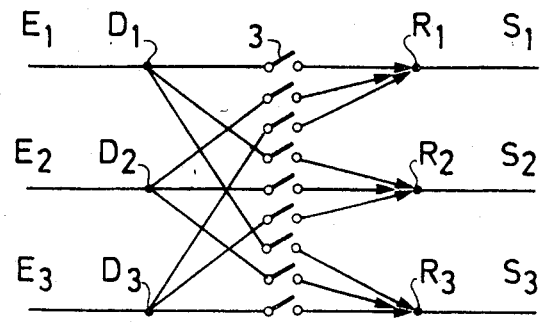
FIG. 4 a general diagram of a parallel distribution switching matrix.

FIG. 4 shows the general diagram of a parallel distribution switching matrix. According to the structure of this switching matrix, a first channel such as $E_1$ can be distributed with a plurality of other channels, such as output channels $S_1$, $S_2$, $S_3$ in series instead of in parallel. The signal from input channel $E_1$ is divided by a power divider $D_1$ into a plurality of signals, each of which passes via a controllable switch 3 before being allocated to an output channel, via a recombination device $R_1$, $R_2$, $R_3$. It is obvious that the small number of input channels $E_1$ to $E_3$ and output channels $S_1$ to $S_3$ serves merely to simplify the drawing and in no way limits the scope of the switch according to the invention.

In a parallel structure, there are no intersection points such as intersection points $P_1$ to $P_4$ shown in the series structure of FIG. 1 and each signal is subdivided into a number equal to the number of output channels. Each channel is separately switched and the outputs are regrouped and recombined on one output of the matrix in a single operation.

In the prior art, the power dividers $D_1$ to $D_3$ in FIG. 4 are passive cascade-connected Wilkinson dividers-combiners. According to this invention, the dividers-combiners are multi-input or multi-output field effect transistors, i.e. multi-sources or multi-drains or multi-gates, but it is advantageous for these transistors to have a gain which maintains the level of the signal constant.

The controllable switches 3 are once again bi-gate field effect transistors. The recombination devices $R_1$ to $R_3$ are preferably multi-input or multi-output field effect transistors, i.e. multi-sources, multi-drains or multi-gates. There is no ambiguity with respect to the fact that the division or recombination systems are multi-source or multi-drain or multi-gate transistors, each connection having its possibilities and disadvantages and the type of connection preferred for forming an integrated circuit according to the invention will be defined hereinafter. These are in fact connections which simplify the integrated circuit construction and preferably make use of the same type of transistor for all the identical functions of the intersection points in an iterative device.

Figure 5:
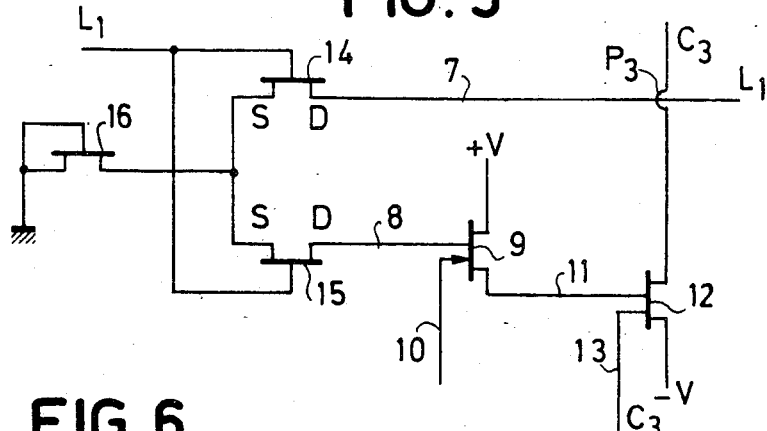
FIG. 5 an intersection point according to the invention for a series distribution structure.

FIG. 5 is a first non-limitative example of the construction of a series structure switching matrix according to the invention. FIG. 5 precisely reproduces the diagram of FIG. 3, but provides further details. Thus, the signals from a row $L_1$ are coupled with a column $C_3$ at an intersection point $P_3$. By comparison with FIG. 3, it can be seen that the combiner system 12 is a bi-gate field effect transistor, whose source is supplied by a voltage $V^-$ and which receives on a first gate the signal 11 from controllable switch 9 and on a second gate signal 13 from column $C_3$.

Controllable switch 9 of FIG. 3 is realized by a bi-gate field effect transistor supplied by a voltage $V^+$, which receives on a first gate the signal 8 from the power divider system and on a second gate control signal 10. It is advantageous for the realization of the invention that the control element 9 and the combiner element 12 are two bi-gate field effect transistors constructed in accordance with the same technology.

Finally, the divider-amplifier 6 of FIG. 3 is in the form of a differential amplifier constituted by two field effect transistors 14, 15. They are connected in a common source manner and supplied by a third field effect transistor 16 connected in a current source manner. The signal carried by the switching matrix row $L_1$ is simultaneously applied to the two gates of transistors 14, 15, which divide it into two equal signals, one being transmitted at 7 on row $L_1$ and the other at 8 to controllable switch 9.

In place of a differential amplifier constituted by two transistors 14, 15, it would be possible to use a single transistor with only one grid to which is applied the signal transmitted on row $L_1$ and with two drains, the first drain corresponding to row $L_1$ at 7 and the second drain to the controllable switch at 8. It would also possible to have a single transistor with one gate and two sources, but in this case there is no gain for compensating switching losses. Finally, it would also be possible to have two amplifiers in parallel.

The controllable switch 9 is in this case represented in the form of a single transistor with two gates. It is known that the equivalent of a bi-gate transistor is two series-connected, mono-gate transistors. These two transistors are connected by a drain and a source and the gate of the first transistor receives the signal from the power divider, the gate of the second transistor receives the control signal, the source of the first transistor receives the bias and the drain of the second transistor constitutes the system output, which is applied to a gate of the signal combiner.

Figure 6:
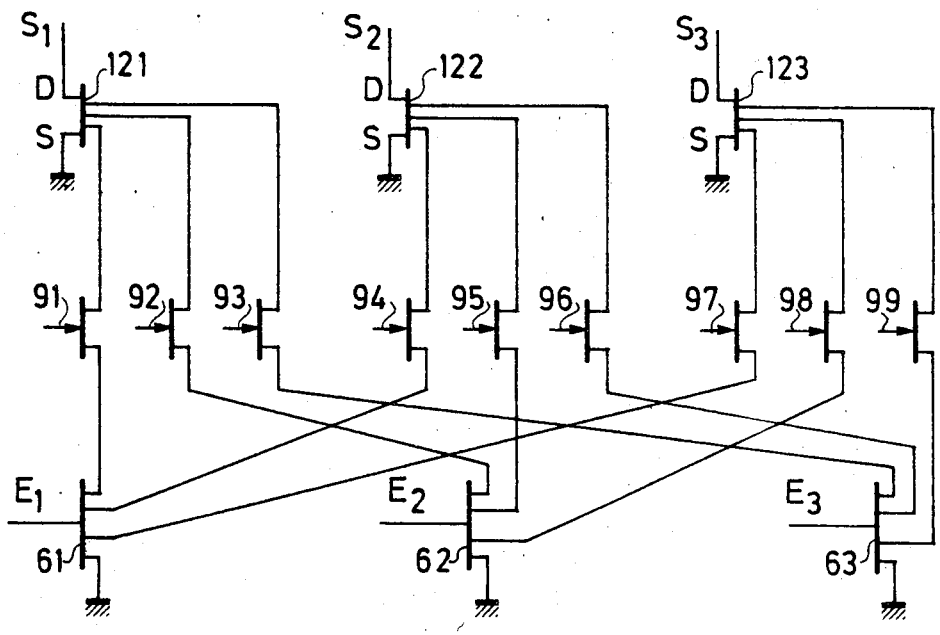
FIG. 6 an intersection point according to the invention for a parallel distribution structure.

FIG. 6 shows an example of a parallel switching matrix according to FIG. 4. However, the parallel organisation of such a switching matrix does not permit the separation therefrom of an intersection point, as was the case with the series switching matrix. It is necessary to represent at least two intersection points, and FIG. 6 uses three of these in a non-limitative manner in order to better correspond to FIG. 2 whereof it gives details.

However, in order to better represent the unity of the invention, the power dividers are designated 61, 62 and 63 in FIG. 6, because they correspond to the power dividers 6 of FIG. 3, whilst the controllable switches are designated 91-99 and the power combiners 121, 122 and 123, which indicates the relationship with the controllable switch 9 and the power combiner 12 of FIG. 3.

The signals from the three inputs $E_1$, $E_2$ and $E_3$ are, in a parallel switching matrix according to the invention, applied to the three gates of the three field effect transistors 61, 62, 63, which correspond to the divider systems $D_1$, $D_2$, $D_3$ of FIG. 4. These transistors have a plurality of drains, each transistor having the same number of drains as there are output channels to be supplied, i.e. in the present case there are three drains for three output channels. The signals from the power divider transistors 61, 62, 63 are supplied to the same number of field effect transistors 91 to 99 as there are input channels, multipled by the number of output channels. Transistors 91 to 99 are the controllable switches and they can be connected in the manner shown in FIG. 6, the signal from divider 61 being applied to the source of a transistor 91. They can also be bi-gate transistors, as represented for transistor 9 of FIG. 5 and one of the two gates receives the signal from a power divider and the other the control signal. In the case represented in FIG. 6, an arrow on the gate of each control transistor symbolizes the control action.

Finally, the signals from the input channels are applied to combiner transistors 121, 122, 123, which in each case have the same number of gates as there are input channels. These field effect transistors 121, 122, 123 have their source connected to earth and the output rows $S_1$, $S_2$ and $S_3$ are each respectively located on the drains of transistors 121, 122, 123.

FIG. 4 in its application of FIG. 6 represents three input channels and three output channels, but it is obvious that this in no way limits the scope of the invention, which can be constituted by a different number of input lines, and a different number of output lines not equal to the number of input lines. However, e.g. for a matrix of 8 inputs and 8 outputs, or 16 inputs and 16 outputs, it is preferable to regroup the combiner transistors 121, 122 and 123, with a number such that the transistors having two or three gate make it possible to combine the different signals.

A special point in the switching matrix according to the invention is constituted by the intersection of metallizations forming the input output lines or the rows and columns as a function of the matrix type. In all cases, it can be seen that the metallizations intersect for linking a first active element with a second active element. In view of the fact that the switching matrix essentially relates to ultra-high frequencies, there can be coupling problems at the semiconductor material pellet on which the integrated circuit is produced. It is for this reason that among other possible solutions, preference is given to known techniques such as air bridges, or the intersection of two conductors via metallized holes in the pellet. With a view to preventing coupling between two intersecting metal lines, it may be necessary to effect a shielding, i.e. to place an earthed metal coating between two metal lines, the metal coating being separated from the two lines by two insulating layers.

What is claimed is:

1. A matrix for switching ultra-high frequency electrical signals from a first plurality of input channels or rows towards a second plurality of output channels or columns, the transfer of a signal from a respective input channel to a respective output channel being carried out at a switching point, said switching matrix being characterized in that each switching point comprises:
   a power divider, whose input receives the signal transferred by a respective input channel and which supplies at its output a signal divided into a plurality of equal signals,
   a controllable switch, controlled by an external signal, which transfers at least one output signal coming from the divider to a power combiner, the combiner transmits the signal transmitted by the switch to a respective output channel, the system constituted by the power divider, the controllable switch and the power combiner being realized by active components of field effect transistor type.

2. A switching matrix according to claim 1, wherein said switching matrix has a series distribution structure, the switching points for only one input channel being connected in series on said input channel for switching towards a plurality of output channels.

3. A switching matrix according to claim 1, having a parallel distribution structure, at each switching point the power divider subdividing the signal of the respective input channel towards a plurality of output channels.

4. A switching matrix according to claim 1, wherein, in each switching point, the power divider is a multi-drain field effect transistor.

5. A switching matrix according to claim 1, wherein the controllable switch is a bi-gate field effect transistor.

6. A switching matrix according to claim 1, wherein the power combiner is a multi-gate field effect transistor.

7. A switching matrix according to claim 1, wherein all switching points are identical.

8. A switching matrix according to claim 1, wherein the elements of the switching points are field effect transistors, signals divided by said the power dividers are then amplified by the gain of said transistors.

9. A switching matrix according to claim 1, is produced as a monolithic integrated circuit.

10. A switching matrix according to claim 9, wherein said monolithic integrated circuit has metallizations constituting the input channels and the output channels, wherein, metallization between channel intersections are isolated by multi-level shielding or by air bridges.

11. A switching matrix according to claim 1 wherein, in each switching point the power divider is a multi-source field effect transistor.

12. A switching matrix according to claim 1 wherein, in each switching point the power divider is a differential amplifier with field effect transistors.

13. A switching matrix according to claim 1 wherein, in each switching point the power divider is comprised of amplifiers with field effect transistors in parallel.

14. A switching matrix according to claim 1 wherein the controllable switch comprises two mono-gate field effect transistors in parallel.

15. A switching matrix according to claim 1 wherein the power combiner comprises: two mono-gate field effect transistor in parallel.

* * * * *